United States Patent
Chung et al.

(10) Patent No.: US 8,643,072 B1
(45) Date of Patent: Feb. 4, 2014

(54) SEMICONDUCTOR STRUCTURE AND METHOD FOR FORMING THE SAME

(75) Inventors: Miao-Chun Chung, Toufen Township, Miaoli County (TW); An-Li Cheng, Tainan (TW); Yin-Fu Huang, Tainan (TW); Shih-Chin Lien, New Taipei (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/547,549

(22) Filed: Jul. 12, 2012

(51) Int. Cl.
*H01L 29/76* (2006.01)

(52) U.S. Cl.
USPC ........................................................ 257/288

(58) Field of Classification Search
USPC .......... 257/173, 335, 355, 360; 438/140, 217, 438/294
See application file for complete search history.

(56) References Cited

U.S. PATENT DOCUMENTS

| 6,838,734 | B2 * | 1/2005 | Ker et al. ........................ 257/360 |
| 7,709,896 | B2 * | 5/2010 | Russ et al. ...................... 257/355 |
| 2009/0250751 | A1 * | 10/2009 | Sutardja et al. ............... 257/335 |
| 2010/0203691 | A1 * | 8/2010 | Wu et al. ........................ 438/217 |

* cited by examiner

*Primary Examiner* — Ha Tran T Nguyen
*Assistant Examiner* — Ismail Muse
(74) *Attorney, Agent, or Firm* — McClure, Qualey & Rodack, LLP (57) ABSTRACT

A semiconductor structure and a method for forming the same are provided. The semiconductor structure includes a bulk, a gate, a source, a drain and a bulk contact region. The gate is on the bulk. The source and the drain are in the bulk on opposing sides of the gate respectively. The bulk contact region is only in a region of the bulk adjacent to the source. The bulk contact region is electrically connected to the bulk.

8 Claims, 6 Drawing Sheets

SEMICONDUCTOR STRUCTURE AND METHOD FOR FORMING THE SAME

BACKGROUND

1. Technical Field

The disclosure relates in general to a semiconductor structure and a method for forming the same and more particularly to a HV semiconductor structure and a method for forming the same.

2. Description of the Related Art

In the semiconductor technology, the feature size of the semiconductor structure has been reduced. In the meantime, the rate, the efficiency, the density and the cost per integrated circuit unit have been improved.

Shrinking the device area would drop the electrical efficiency of the semiconductor structure dramatically. For maintain the electrical efficiency of the semiconductor structure, especially in a case of HV device, the semiconductor structure must use a big device area. However, it retards development for scaling down the semiconductor structure.

SUMMARY

A semiconductor structure is provided. The semiconductor structure includes a bulk, a gate, a source, a drain and a bulk contact region. The gate is on the bulk. The source and the drain are in the bulk on opposing sides of the gate respectively. The bulk contact region is only in a region of the bulk adjacent to the source. The bulk contact region is electrically connected to the bulk.

A semiconductor structure is provided. The semiconductor structure includes a bulk, a gate, a source, a drain, a channel region and a bulk contact region. The gate is on the bulk. The source and the drain are in the bulk on opposing sides of the gate respectively. The channel region is below the gate and between the source and the drain. The channel region has a first size. The bulk contact region is in a region of the bulk and electrically connected to the bulk. The bulk contact region has a second size. The second size is substantially bigger than or equal to 50% of the first size.

A method for forming a semiconductor structure is provided. The method comprises following steps. A gate is formed on a bulk. A source and a drain are formed in the bulk on opposing sides of the gate respectively. A bulk contact region is formed only in a region of the bulk adjacent to the source. The bulk contact region is electrically connected to the bulk.

The above and other aspects of the disclosure will become better understood with regard to the following detailed description of the non-limiting embodiment(s). The following description is made with reference to the accompanying drawings.

DETAILED DESCRIPTION

Figure 1:
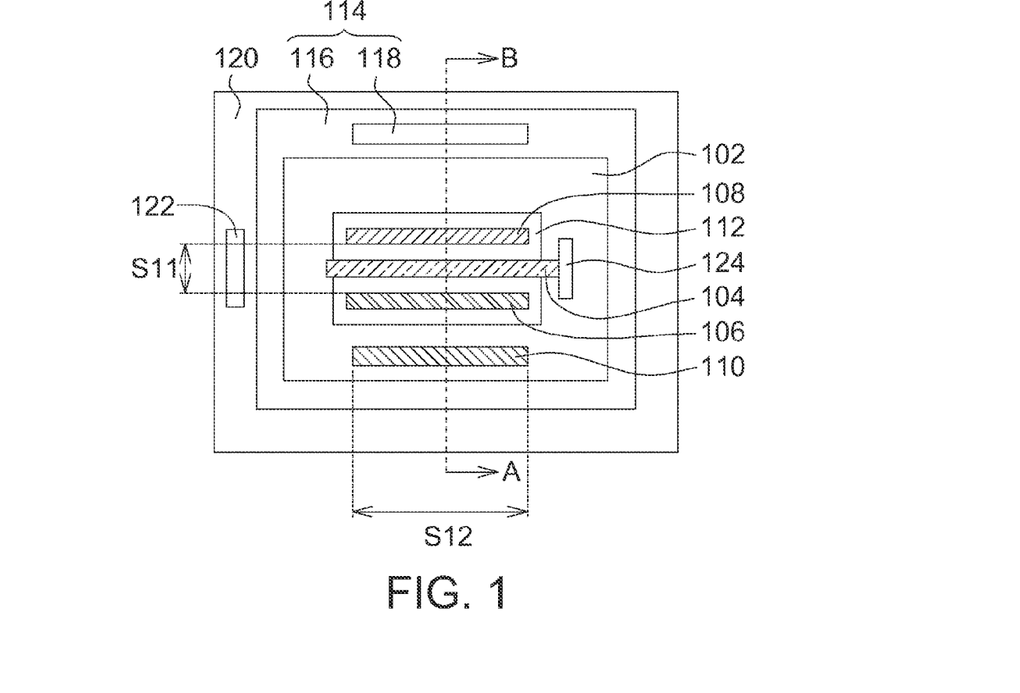
FIG. 1 illustrates a top view of a semiconductor structure according to one embodiment.

FIG. 1 illustrates a top view of a semiconductor structure according to one embodiment. The semiconductor structure comprises a bulk 102, a gate 104, a source 106, a drain 108 and a bulk contact region 110. The gate 104, the source 106, the drain 108 and the bulk contact region 110 are in the bulk 102. The lightly doped region 112 may be formed in the bulk 102. In other embodiments, the lightly doped region 112 may be omitted. The source 106 and the drain 108 are on opposing sides of the gate 104 respectively. The bulk 102 may be formed by defining by an isolation element 114. The isolation element 114 may comprise a first doped region 116 and a second doped region 118 formed in the first doped region 116. The second doped region 118 may be a heavily doped region. The isolation element 114 may be formed in the substrate 120. The substrate 120 may be electrically connected to a substrate contact region 122. The gate 104 may be electrically connected to a gate contact region 124.

Referring to FIG. 1, in embodiments, the bulk 102, the substrate 120 and the substrate contact region 122 may have a first type conductivity. The bulk contact region 110 may comprise a doped region such as a heavily doped region formed in the bulk 102, and have the first type conductivity. However, the present disclosure is not limited thereto. In other embodiments, the bulk contact region 110 may comprise a region where the bulk 102 is contact with and electrically connected to other contact elements (not shown). In detail, for example, the region is an interface between the bulk 102 and the other contact elements (not shown). For example, the contact elements may comprise conductive plugs, conductive vias and so on. The bulk 102 may be electrically connected to the contact elements so as to be electrically connected to a voltage terminal such as a ground terminal through the bulk contact region 110. The bulk contact region 110 may be referred to as a bulk pick-up region for pick up carriers such as electrons and hoes generated during an operating of the semiconductor structure. The source 106, the drain 108, the lightly doped region 112 and the first doped region 116 and the second doped region 118 of the isolation element 114 may have a second type conductivity opposite to the first type conductivity. For example, the first type conductivity is N type conductivity, and the second type conductivity is P type conductivity. Alternatively, the first type conductivity is P type conductivity, and the second type conductivity is N type conductivity.

Referring to FIG. 1, the bulk contact region 110 is only in a region of the bulk 102 adjacent to the source 106. In one embodiment, the bulk contact region 110 and the gate 104 are on opposing sides of the source 106 respectively.

Referring to FIG. 1, a channel region between the source 106 and the drain 108 has a first size S11. The bulk contact region 110 has a second size S12. The second size S12 is substantially bigger than or equal to 50% of the first size S11.

For example, the second size S12 is substantially bigger than or equal to 50% of the first size S11 and smaller than or equal to 85% of the first size S11. In one embodiment, a direction of the first size S11 is substantially perpendicular to a direction of the second size S12. In one embodiment, the first size S11 is along a carrier flow direction in the channel region. The second size S12 is along a long axis direction of the bulk contact region 110.

Figure 2:
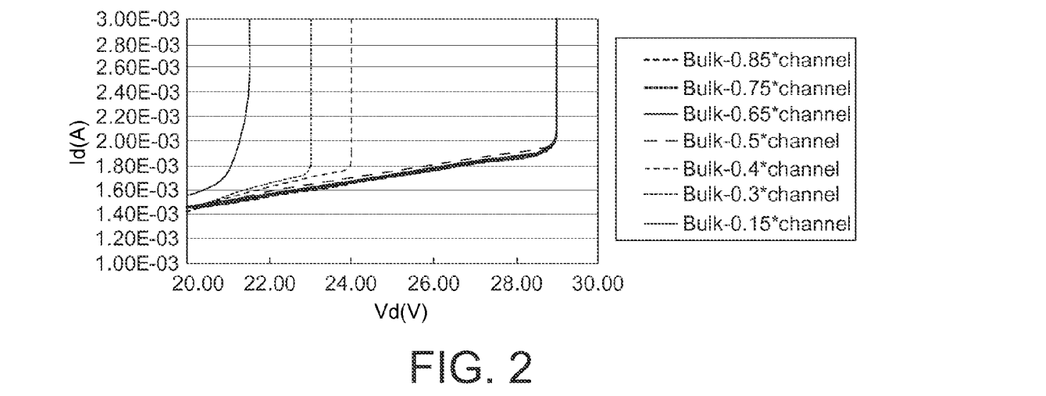
FIG. 2 shows Id-Vd curves of the semiconductor structures according to embodiments.

FIG. 2 shows Id-Vd curves of the semiconductor structures according to embodiments. The semiconductor structures are isolated HVNMOSs. Tests are conducted at 25°. A gate voltage (Vg) is 38V (Isub maximum), a drain voltage (Vd) is 0V~32V, a source voltage is (Vs) is 0V, and a bulk voltage (Vb) is 0V (grounded). FIG. 2 shows that the on-BVD (about 29V) of the semiconductor structure having the bulk contact region with the second size equal to 50%~85% of the first size of the channel region is specifically bigger than the on-BVD (about 24V) of the semiconductor structure having the bulk contact region with the second size equal to 40% of the first size of the channel region, and bigger than the on-BVD (about 23V) of the semiconductor structure having the bulk contact region with the second size equal to 30% of the first size of the channel region, and bigger than the on-BVD (about 21V) of the semiconductor structure having the bulk contact region with the second size equal to 15% of the first size of the channel region. From the results, it is found that the HVN-MOS can have the optimum on-BVD as the second size of the bulk contact region is substantially bigger than or equal to 50% of the first size of the channel region.

Figure 3:
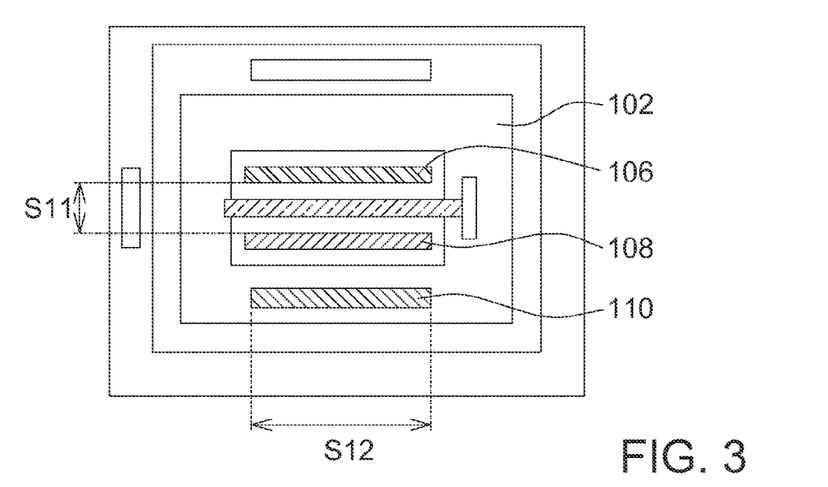
FIG. 3 illustrates a top view of a semiconductor structure according to one embodiment.

FIG. 3 illustrates a top view of a semiconductor structure according to one embodiment. The semiconductor structure as shown in FIG. 3 is different from the semiconductor structure as shown in FIG. 1 in that the bulk contact region 110 is only in a region of the bulk 102 adjacent to the drain 108 and away from the source 106. The channel region between the source 106 and the drain 108 has the first size S11. The bulk contact region 110 has the second size S12.

Figure 4:
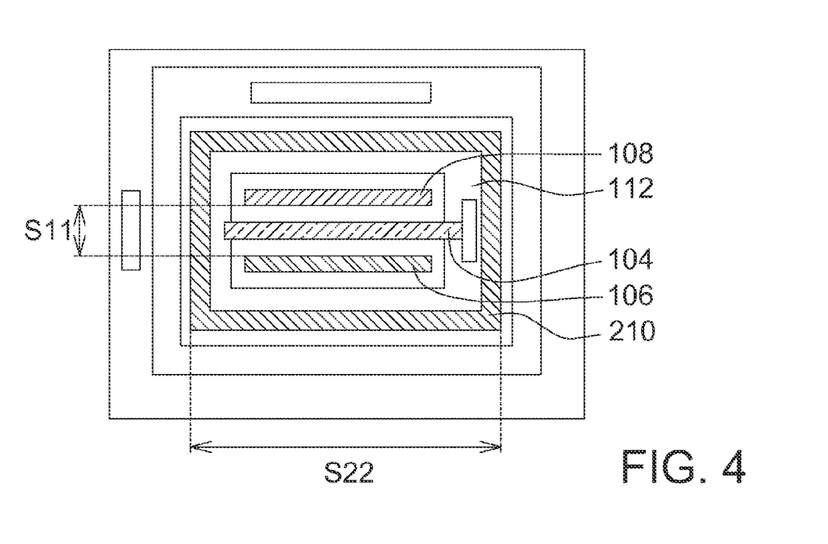
FIG. 4 illustrates a top view of a semiconductor structure according to one embodiment.

FIG. 4 illustrates a top view of a semiconductor structure according to one embodiment. The semiconductor structure as shown in FIG. 4 is different from the semiconductor structure as shown in FIG. 1 in that the bulk contact region 210 has a rectangular ring profile. In addition, the gate 104, the source 106, the drain 108 and the lightly doped region 112 are surrounded by the bulk contact region 210. The channel region between the source 106 and the drain 108 has the first size S11. The bulk contact region 210 has the second size S22.

Figure 5:
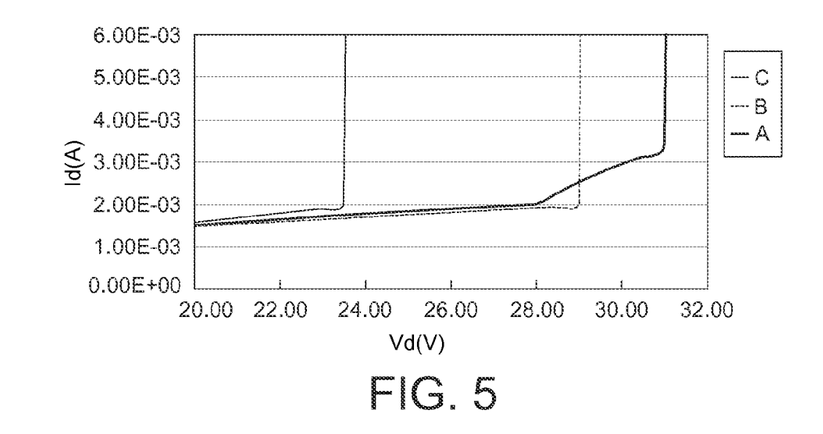
FIG. 5 shows Id-Vd curves of the semiconductor structures according to embodiments.

FIG. 5 shows Id-Vd curves of the semiconductor structures according to embodiments. The curve A indicates an electricity curve of the semiconductor structure according to FIG. 4. The curve B indicates an electricity curve of the semiconductor structure according to FIG. 1. The curve C indicates an electricity curve of the semiconductor structure according to FIG. 3. The semiconductor structures are isolated HVN-MOSs. The second size of the bulk contact region is substantially bigger than or equal to 50% of the first size. Tests are conducted at 25°. A gate voltage (Vg) is 38V (Isub maximum), a drain voltage (Vd) is 0V~32V, a source voltage is (Vs) is 0V, and a bulk voltage (Vb) is 0V (grounded). FIG. 5 shows that the on-BVD (about 29V) of the semiconductor structure (FIG. 1) having the bulk contact region 110 only in the region of the bulk 102 adjacent to the source 106 is specifically bigger than the on-BVD (about 23V) of the semiconductor structure (FIG. 3) having the bulk contact region 110 only in the region of the bulk 102 adjacent to the drain 108. In addition, the on-BVD (about 29V) of the semiconductor structure (FIG. 1) having the bulk contact region 110 only in the region of the bulk 102 adjacent to the source 106 is close to the on-BVD (about 31V) of the semiconductor structure (FIG. 4) having the bulk contact region 210 having the rectangular ring profile. The semiconductor structure as shown in FIG. 1 can use a device area smaller than a device area that the semiconductor structure as shown in FIG. 4 needs. Therefore, the semiconductor structure having the bulk contact region 110 only in the region of the bulk 102 adjacent to the source 106 as shown in FIG. 1 can achieve decreasing the device area and maintaining good electrical efficiency of the device.

Figure 6:
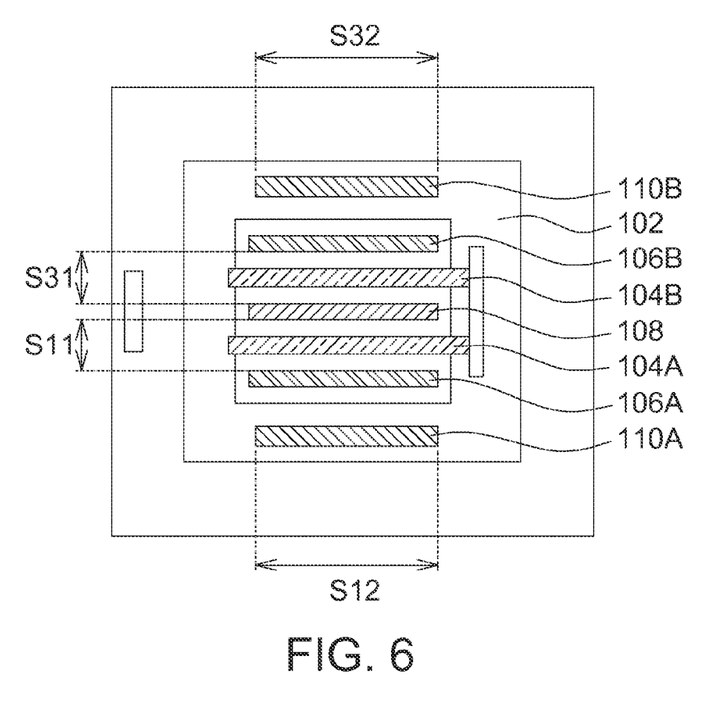
FIG. 6 illustrates a top view of a semiconductor structure according to one embodiment.

FIG. 6 illustrates a top view of a semiconductor structure according to one embodiment. The semiconductor structure as shown in FIG. 6 is different from the semiconductor structure as shown in FIG. 1 in that the gate comprises a first gate 104A and a second gate 104B on opposing sides of the drain 108 respectively. The source comprises a first source 106A and a second source 106B. The first source 106A is in the bulk 102 on a side of the first gate 104A away from the drain 108. The second source 106B is in the bulk 102 on a side of the second gate 104B away from the drain 108. The bulk contact region comprises a first bulk contact region 110A and a second bulk contact region 110B. The first bulk contact region 110A is only in a region of the bulk 102 adjacent to the first source 106A and is electrically connected to the bulk 102. The second bulk contact region 110B is only in a region of the bulk 102 adjacent to the second source 106B and is electrically connected to the bulk 102. In one embodiment, the first gate 104A and the first bulk contact region 110A are on opposing sides of the first source 106A respectively. The second gate 104B and the second bulk contact region 110B are on opposing sides of the second source 106B respectively.

Referring to FIG. 6, in embodiments, the second size S12 of the first bulk contact region 110A is substantially bigger than or equal to 50% of the first size S11 of the channel region between the first source 106A and the drain 108. For example, the second size S12 is substantially bigger than or equal to 50% of the first size S11 and smaller than or equal to 85% of the first size S11. In one embodiment, a direction of the first size S11 is substantially perpendicular to a direction of the second size S12. In one embodiment, the first size S11 is along a carrier flow direction in the channel region. The second size S12 is along a long axis direction of the first bulk contact region 110A. Referring to FIG. 6, the second size S32 of the second bulk contact region 110B is substantially bigger than or equal to 50% of the first size S31 of the channel region between the second source 106B and the drain 108. For example, the second size S32 is substantially bigger than or equal to 50% of the first size S31 and smaller than or equal to 85% of the first size S31. In one embodiment, a direction of the first size S31 is substantially perpendicular to a direction of the second size S32. In one embodiment, the first size S31 is along a carrier flow direction in the channel region. The second size S32 is along a long axis direction of the second bulk contact region 110B. The semiconductor structure as shown in FIG. 6 can have a small device area and maintain the on-BVD.

Figure 7:
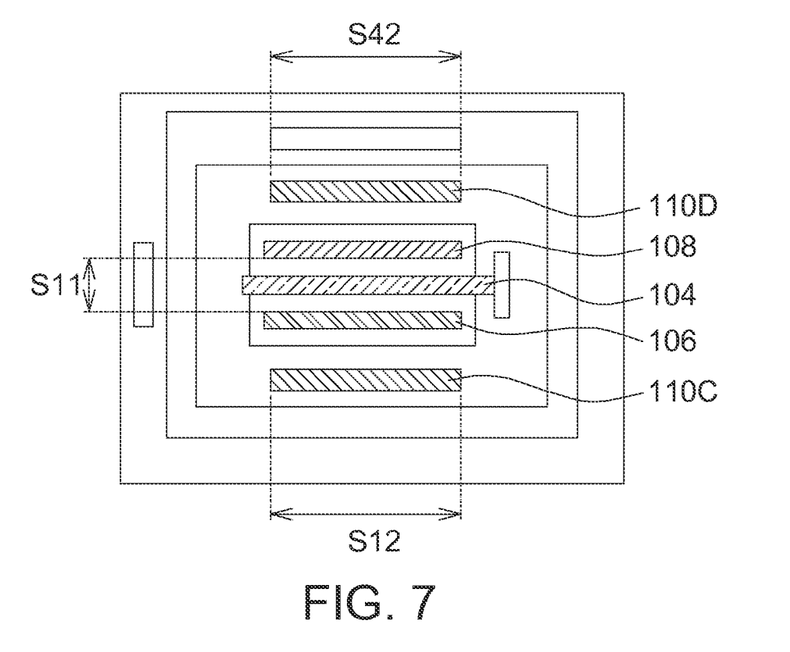
FIG. 7 illustrates a top view of a semiconductor structure according to one embodiment.

FIG. 7 illustrates a top view of a semiconductor structure according to one embodiment. The semiconductor structure as shown in FIG. 7 is different from the semiconductor structure as shown in FIG. 1 in that the bulk contact region comprises the first bulk contact region 110C and the second bulk contact region 110D. The first bulk contact region 110C may be on a side of the source 106 away from the gate 104. The second bulk contact region 110D may be on a side of the drain 108 away from the gate 104. In one embodiment, the first bulk contact region 110C and the second bulk contact region 110D are separated from each other by the gate 104, the source 106 and the drain 108. In embodiments, the second size S12 of the first bulk contact region 110C and the second size S42 of the second bulk contact region 110D are both substantially bigger than or equal to 50% of the first size S11 of the channel region. For example, the second size S12 of the first bulk contact region 110C and the second size S42 of the second bulk contact region 110D are both substantially bigger than or equal to 50% of the first size S11 of the channel region and smaller than or equal to 85% of the first size S11. In one embodiment, a direction of the first size S11 is substantially perpendicular to a direction of the second size S12, S42. In one embodiment, the first size S11 is along a carrier flow direction in the channel region. The second size S12 is along a long axis direction of the first bulk contact region 110C. The second size S42 is along a long axis direction of the second bulk contact region 110D. The semiconductor structure as shown in FIG. 7 can have a small device area and maintain the on-BVD.

Figure 8:
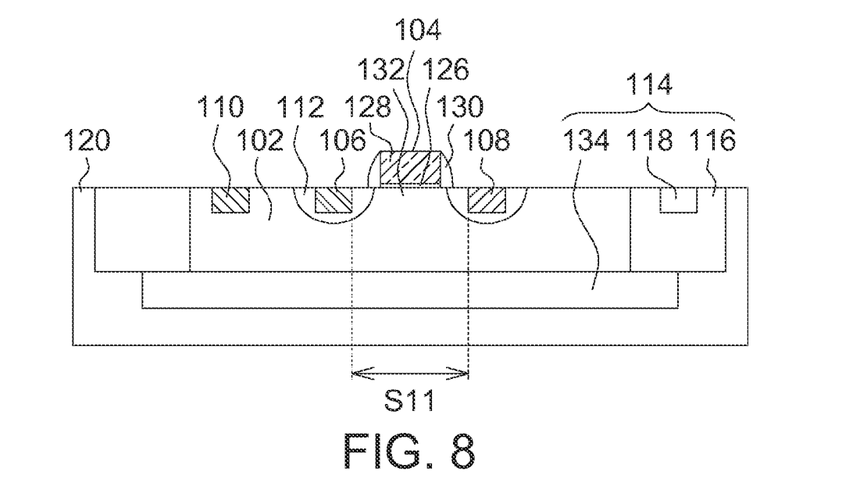
FIG. 8 illustrates a cross-section view of a semiconductor structure according to one embodiment.

FIG. 8 illustrates a cross-section view of a semiconductor structure according to one embodiment, which may be drawn along AB line in FIG. 1. The gate 104 is on the bulk 102. The gate 104 may comprise a dielectric layer 126, an electrode layer 128 and a spacer 130. The source 106 and the drain 108 are in the bulk 102 on the opposing sides of the gate 104 respectively. The lightly doped region 112 is in the bulk 102 on a side of the gate 104. The bulk contact region 110 is only in the region of the bulk 102 adjacent to the source 106. In one embodiment, the bulk contact region 110 is a doped region formed in the bulk 102. The channel region 132 is below the gate 104 and between the source 106 and the drain 108. The channel region 132 has the first size S11. The bulk 102 may be formed by defining by the isolation element 114. The isolation element 114 may comprise and is not limited to the first doped region 116, the second doped region 118 and a buried layer 134. In other embodiments, other kinds of the isolation elements (not shown) such as deep trench isolations formed by dielectric materials may be used. In one embodiment, the first doped region 116, the second doped region 118 and the buried layer 134 all have the second type conductivity. The substrate 120 and the bulk 102 have the first type conductivity.

Figure 9:
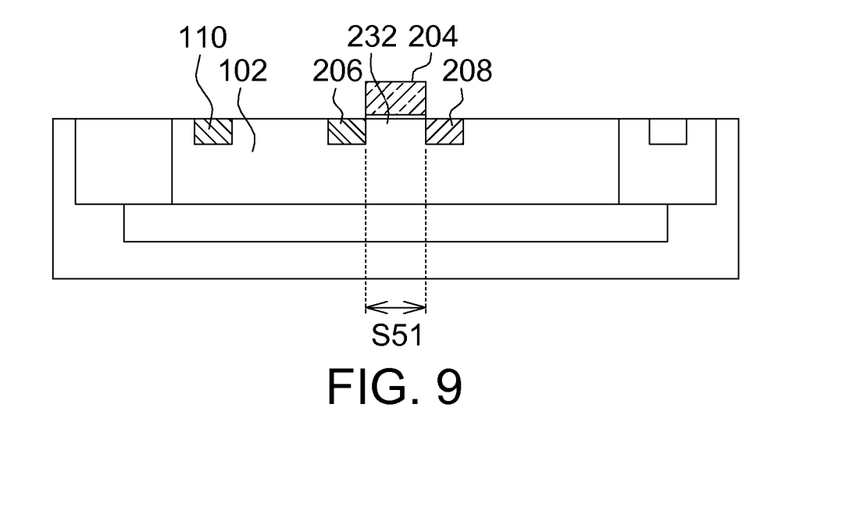
FIG. 9 illustrates a cross-section view of a semiconductor structure according to one embodiment.

FIG. 9 illustrates a cross-section view of a semiconductor structure according to one embodiment. The semiconductor structure as shown in FIG. 9 is different from the semiconductor structure as shown in FIG. 8 in that the lightly doped region 112 and the spacer 130 of the gate 104 shown in FIG. 8 are omitted. The channel region 232 is below the gate 204 and between the source 206 and the drain 208. The channel region 232 has the first size S51. The bulk contact region 110 is only in a region of the bulk 102 adjacent to the source 206 and is electrically connected to the bulk 102.

Figure 10:
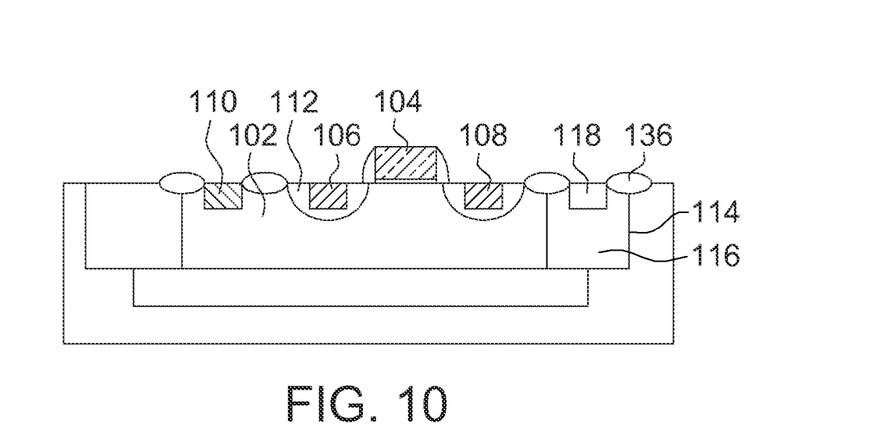
FIG. 10 illustrates a cross-section view of a semiconductor structure according to one embodiment.

FIG. 10 illustrates a cross-section view of a semiconductor structure according to one embodiment. The semiconductor structure as shown in FIG. 10 is different from the semiconductor structure as shown in FIG. 8 in that a dielectric element 136 is formed on the bulk 102 and the isolation element 114. The source 106 and the drain 108 may be separated from the bulk contact region 110 or the second doped region 118 of the isolation element 114 by the dielectric element 136. In embodiments, the dielectric element 136 is not limited to a FOX. The dielectric element 136 may comprise other suitable structures such as a shallow trench isolation (not shown).

Figure 11:
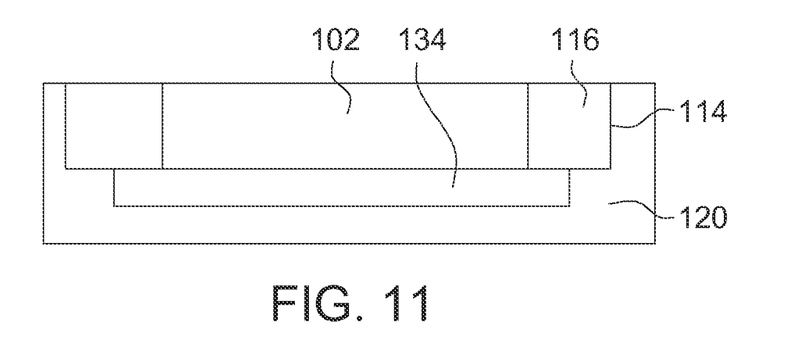
FIG. 11 to FIG. 12 illustrate a process for manufacturing the semiconductor structure according to one embodiment.
Figure 12:
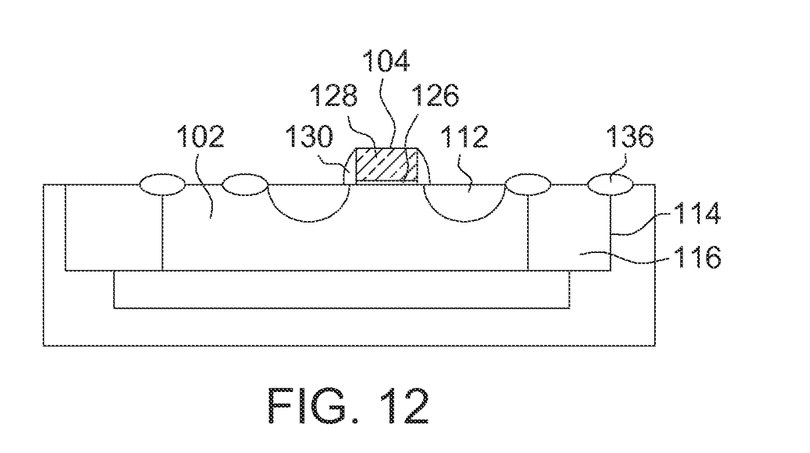

FIG. 11 to FIG. 12 illustrate a process for manufacturing the semiconductor structure according to FIG. 10. Referring to FIG. 11, the substrate 120 is provided. The substrate 120 may comprise and is not limited to a (N type or P type) polished wafer, a silicon on insulator wafer (SOI), an EPI layer (such as P/P−, P/P+, N/N+), an (N type or P type) argon anneal wafer, SiC, GaAs, AlN, ZnO, or other suitable semiconductor materials.

Referring to FIG. 11, for example, the bulk 102 and the buried layer 134 and the first doped region 116 of the isolation element 114 are formed in the substrate 120 having the first type conductivity. The buried layer 134 and the first doped region 116 of the isolation element 114 may be formed by doping a dopant of the second type conductivity into the substrate 120. For example, after the buried layer 134 is formed by doping a top portion of a substrate 120, an epitaxial layer is formed on the substrate 120 and the buried layer 134. Then, the first doped region 116 is formed by doping the epitaxial layer. In one embodiment, the bulk 102 may be formed by doping a dopant of the first type conductivity into the substrate 120 (or the epitaxial layer).

Referring to FIG. 12, the dielectric layer 126 of the gate 104 is formed on the bulk 102. The dielectric layer 126 may comprise and is not limited to an oxide or a nitride, such as silicon oxide, silicon nitride, silicon oxynitride and so on. The electrode layer 128 is formed on the dielectric layer 126 of the gate 104. The electrode layer 128 may comprise and is not limited to a metal, a polysilicon, a metal silicide and so on. The spacer 130 is formed on sidewalls of the dielectric layer 126 and the electrode layer 128 of the gate 104. The spacer 130 may comprise and is not limited to an oxide or a nitride, such as silicon oxide, silicon nitride, silicon oxynitride and so on. The lightly doped region 112 is formed by doping a dopant of the second type conductivity into the bulk 102 on a sidewall of the gate 104. The dielectric element 136 is formed on the bulk 102 and the first doped region 116 of the isolation element 114. The dielectric element 136 is not limited to the FOX as shown in FIG. 2. In other embodiments, for example, the dielectric element 136 may comprise a shallow trench isolation.

Referring to FIG. 10, the source 106 and the drain 108 are formed in the bulk 102 on the opposing sides of the gate 104 respectively. The source 106 and the drain 108 may be formed by doping a dopant of the second type conductivity into the lightly doped region 112. For example, the bulk contact region 110 is be formed by doping a dopant of the first type conductivity into the bulk 102. The second doped region 118 may be formed by doping a dopant of the second type conductivity into the first doped region 116.

The method for manufacturing the semiconductor structure according to embodiments is simple and can be applied to all kinds of circuit designs. For example, the semiconductor structure is MOSFET, PMOS, NMOS, EDNMOS, EDPMOS, LDNMOS, LDPMOS, LDD MOS, DDDNMOS, BCD, or other possible devices. The semiconductor structure also can be applied to HV devices.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
a bulk;
a gate on the bulk;
a source;
a drain, wherein the source and the drain are in the bulk on opposing sides of the gate respectively;

a channel region below the gate and between the source and the drain, wherein the channel region has a first size; and a bulk contact region in a region of the bulk and electrically connected to the wherein the bulk contact region has a second size, the second size is substantially bigger than or equal to 50% of the first size and smaller than or equal to 85% of the first size.

2. The semiconductor structure according to claim 1, wherein the bulk contact region is only in a region of the bulk adjacent to the source.

3. The semiconductor structure according to claim 1, wherein a direction of the first size is substantially perpendicular to a direction of the second size.

4. The semiconductor structure according to claim 1, wherein the first size is along a carrier flow direction in the channel region, the second size is along a long axis direction of the bulk contact region.

5. The semiconductor structure according to claim 1, wherein the bulk contact region comprises a first bulk contact region and a second bulk contact region, the first bulk contact region is on a side of the source away from the gate, the second bulk contact region is on a side of the drain away from the gate, the second size of the first bulk contact region and the second size of the second bulk contact region are both substantially bigger than or equal to 50% of the first size.

6. The semiconductor structure according to claim 5, wherein the first bulk contact region and the second bulk contact region are separated from each other by the gate, the source and the drain.

7. The semiconductor structure according to claim 1, wherein the bulk contact region is a doped region formed in the bulk, the bulk and the bulk contact region have a first type conductivity, the source and the drain have a second type conductivity opposite to the first type conductivity.

8. A method for forming a semiconductor structure, comprising:

forming a gate on a bulk;

forming a source and a drain in the bulk on opposing sides of the gate respectively, wherein a channel region between the source and the drain has a first size; and forming a bulk contact region in the bulk, wherein the bulk contact region is electrically connected to the bulk and the bulk contact region has a second size substantially bigger than or equal to 50% the first size.

* * * * *